United States Patent [19]

Ho et al.

[11] Patent Number: 4,728,534

[45] Date of Patent: Mar. 1, 1988

[54] THICK FILM CONDUCTOR STRUCTURE

[75] Inventors: Roland K. Ho, Elgin; Richard H. Jung, Park Ridge, both of Ill.

[73] Assignee: Motorola, Inc., Schaumburg, Ill.

[21] Appl. No.: 892,629

[22] Filed: Aug. 4, 1986

[51] Int. Cl.⁴ .............................................. B05D 5/12
[52] U.S. Cl. ................................... 427/103; 338/307; 338/308; 357/67; 357/71; 427/102
[58] Field of Search ..................... 338/307, 308, 309; 427/96, 102, 103; 357/67, 71

[56] References Cited

U.S. PATENT DOCUMENTS

| | | | |
|---|---|---|---|
| 2,419,537 | 4/1947 | Christensen | 427/103 |
| 3,900,598 | 8/1975 | Hall et al. | 357/67 |
| 4,016,525 | 4/1977 | Maher et al. | 338/309 |
| 4,031,272 | 6/1977 | Khanna | 427/102 |
| 4,053,866 | 10/1977 | Merz et al. | 427/102 |
| 4,072,771 | 2/1978 | Grier, Sr. | 427/96 |
| 4,140,817 | 2/1979 | Brown | 427/102 |
| 4,311,730 | 1/1982 | Pedder | 427/102 |
| 4,441,118 | 4/1984 | Fister et al. | 357/67 |
| 4,491,860 | 1/1985 | Lim | 357/67 |
| 4,503,090 | 3/1985 | Brown | 427/96 |
| 4,546,373 | 10/1985 | Todd et al. | 357/67 |

OTHER PUBLICATIONS

DuPont's MYDAS (TM) System Press Release.

Primary Examiner—John E. Kittle
Assistant Examiner—Terry J. Owens
Attorney, Agent, or Firm—Robert J. Crawford

[57] ABSTRACT

In one embodiment of the present invention a thick film resistor structure comprising common materials is disclosed. The structure includes a supporting carrier as a base for the thick film resistor arrangement, which comprises a resistive material printed on the carrier, first and second noble metal terminating layers connected to either side of the resistive material, first and second barrier layers respectively connected to the first and second noble metal terminating layers, and first and second conducting layers respectively connected to said first and second barrier layers. The barrier layers are preferably composed of nickel or tungsten, whereas the noble metal terminating layers are preferably composed of silver. The resistive material, being formed between the terminating layers, is electrically connected to said copper conducting layers to form a precise thick film resistor structure whose resistance is measurable between said conducting layers.

15 Claims, 7 Drawing Figures

THICK FILM CONDUCTOR STRUCTURE

FIELD OF THE INVENTION

The present invention relates generally to thick film conductors and, more particularly, to the practice of manufacturing precisely characterized thick film resistors to thick film conductors

DESCRIPTION OF THE PRIOR ART

Thick film resistors have been successfully utilized to reduce circuit board real estate for some time. Due to the popularity of thick film resistors, there have been recent attempts to employ such resistors in applications which require highly precise resistor characteristics, such as low thermal coefficient of resistance (TCR), and low resistance drift. In some applications the thermal coefficient of resistance is required to be less than 100 ppm, while the resistance drift must not exceed 5%. Such constraints have not been overcome without substantial expense and/or difficulty.

There are known structures which use commercially available resistive inks to meet such precise characteristics as aforementioned. However, to meet these characteristics, these structures utilize expensive silver conductive runners extending from either end of the resistive ink. Despite the expense of the silver, such circuits employing this ink are commonly used. To realize cost savings, much effort has been made to effect the same result with less expensive materials and techniques.

However, the techniques resulting from these efforts have disadvantages. For example, some techniques require a non-standard thick film resistive ink which must be capable of being fired several times without undergoing severe resistance changes. Additionally, many of these techniques require equipment for special processing which is not typically available in the common manufacturing facility.

Other thick film resistor techniques require special conductive hybrid materials An example of such a material is described by John F. Brown and Robert M. Stanton in U.S. Pat. No. 4,503,090, "Thick Film Resistor Circuits". Brown and Stanton describe a resistor structure which requires a fritless paste comprising primarily copper along with 1 to 25 percent of silver. This fritless compound, as well as most other types of special compounds, requires additional expense in processing time and additional equipment overhead to form the compound into the resistor structure.

Another problem is introduced by these less expensive techniques. These techniques do not provide a method for correcting problems that arise during processing. Generally, if the resistor fails to meet specifications after the manufacturing process is complete, the circuit is discarded and the entire process must be repeated with another circuit.

Accordingly, there is a need for a precisely characterized thick film resistor and conductor structure and process which can be efficiently manufactured using standard materials and standard processing techniques.

OBJECTS AND SUMMARY OF THE PRESENT INVENTION

It is a general object of the present invention to provide a method for manufacturing thick film structures which overcomes the above described shortcomings.

It is an additional object of the present invention to provide a method for manufacturing thick film structures which is less expensive and more precise than those known previously.

It is an additional object of the present invention to provide an improved thick film resistor structure which can maintain precise characteristics over a wide temperature span.

The invention may briefly be described in terms of a preferred embodiment of a thick film conductor structure which comprises common materials. The structure includes a supporting carrier as a base for the thick film resistor arrangement. Secured to the carrier is a resistive material, first and second noble metal terminating layers connected to either side of the resistive material, first and second barrier layers respectively connected to the first and second noble metal terminating layers, and first and second conducting layers respectively connected to said first and second barrier layers. The barrier layers are preferably composed of nickel or tungsten, whereas the noble metal terminating layers are preferably composed of silver. The resistive material, being formed between the terminating layers, is electrically connected to said copper conducting layers to form a precise thick film resistor structure whose resistance is measurable between said conducting layers.

BRIEF DESCRIPTION OF THE DRAWINGS

The features of the present invention which are believed to be novel are set forth with particularity in the appended claims. The invention, together with further objects and advantages thereof, may best be understood by making reference to the following description taken in conjunction with the accompanying drawing, in which like reference numerals identify like elements, and wherein:

DETAILED DESCRIPTION OF THE PREFERRED EMBODIMENT

Figure 1:
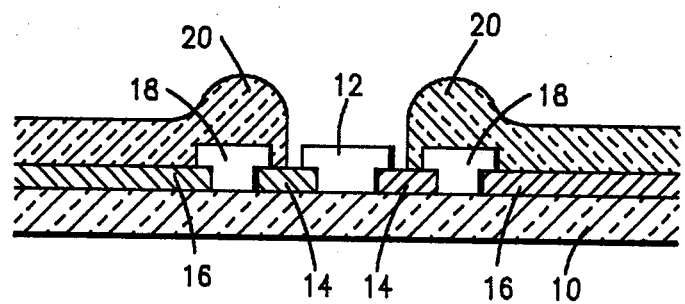
FIG. 1 is cross-sectional view of a thick film structure which has been manufactured in accordance with the present invention.

In FIG. 1, a cross-sectional view of a thick film resistor structure is depicted in accordance with the present invention. A carrier plate 10 supports the structure, which comprises several types of layered materials. The first material is a conducting layer 16 which is shown on the left and on the right in FIG. 1. The conducting layer is preferably composed of copper, and may be used as a printed circuit (PC) runner to electrically connect the resistor structure to other elements in the application circuit.

The core of the resistive structure is depicted as resistive material 12. It is shown partially overlaying resistor terminating layers 14. Commercially available resistive inks, such as DuPont's 1600 series resistive inks, may be used for resistive material 12.

The resistor terminating layers 14 are preferably composed of a noble metal or a noble metal alloy. Using a noble metal permits such termination to sustain high resistance to oxidation during processing. The noble metal family includes:

| rhenium | ruthenium | rhodium |
| palladium | silver | osmium |
| iridium | platinum | gold |

However, silver or a silver alloy is preferred because of the high conductivity qualities of silver.

The resistor terminating layers 14 connect the resistive material 12 to the conducting layers 16 through barrier layers 18. Barrier layers 18 are preferably composed of nickel or tungsten. It has been discovered that using barrier layers of this type prevent diffusion from occurring between the resistor terminating layers 14 and the conducting layers 16. Since the preferred material in the resistor terminating layers 14 contains silver, and the preferred material in the conducting layers 16 is copper, diffusion between the silver and the copper would result in separation between the two layers at high temperatures. Hence, the barrier layers allow the resistor (12) to be terminated with silver, while still employing inexpensive conductor means, such as copper, to be used for standard PC board connections (runners) between circuit elements.

A dielectric material 20, which covers the conducting layers 16 and the barrier layers 18, is used to prevent oxidation from occurring on the conducting layer 16 during the step of firing the resistor.

Although the embodiment shown in FIG. 1 is the preferred embodiment, it should be understood that alternative embodiments could be realized without departing from the scope herein. For example, the resistive material may be coupled to a conducting layer on one side as shown in FIG. 1, while on the other side the resistor may be directly connected to a silver conducting layer. Alternatively, the illustration in FIG. 1 could be modified such that the resistive material has an additional center tap extending from it.

In FIGS. 2a through 2e, the resistor structure described in FIG. 1 is illustrated at various steps in the manufacturing process. For clarity, it should be noted that the carrier 10 from FIG. 1 is not shown in FIGS. 2a through 2e.

Figure 2A:
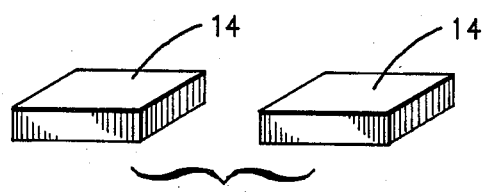
FIGS. 2a through 2e comprise a series of illustrations depicting the thick film structure shown in FIG. 1 during different steps in the manufacturing process.
Figure 2B:
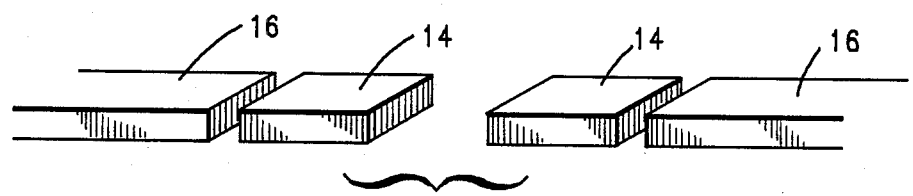

In FIG. 2a, the first step of the process is illustrated. The resistor terminating layers 14 are printed and fired. The terminating layers 14 are fired in air for a 30 to 60 minute cycle with a peak temperature of 850° to 950° C. for 5 to 10 minutes The next step is illustrated in FIG. 2b. The conducting layers 16 are printed and dried. The drying process is preferably 10 to 15 minutes at 150° C.

Figure 2C:
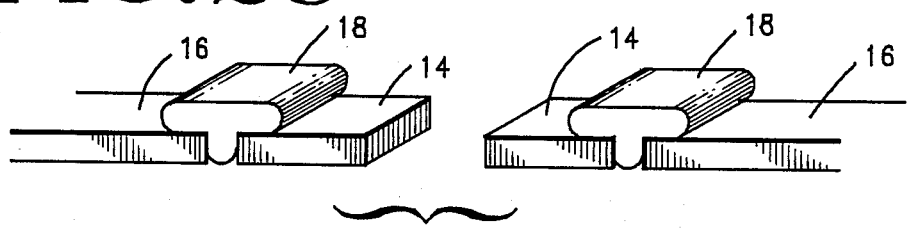

In FIG. 2c, the structure is shown including the barrier layer 18. The barrier layer 18 is printed between the conducting layers 16 and the terminating layers 14 such that the barrier layer amply overlays each to provide substantial contact interface. After the barrier layer is printed, it is dried for 10 to 15 minutes at 150° C. Next, the barrier layers 18, the conducting layers 16 and the terminating layers 14 are simultaneously fired (cofired) in nitrogen for a 30 to 60 minute cycle with a peak temperature of 850° to 950° C. for 5 to 10 minutes.

Figure 2D:
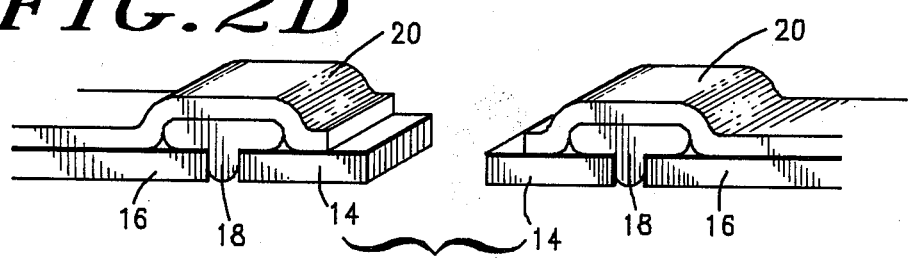

In FIG. 2d, the dielectric 20 is depicted in the structure substantially overlaying the conducting layers 16, covering the barrier layers 18 and partly covering the terminating layers 14. The dielectric layer is printed as such, and is fired in nitrogen (cofired) under the same conditions as above, i.e., for a 30 to 60 minute cycle with a peak temperature of 850° to 950° C. for 5 to 10 minutes.

Figure 2E:
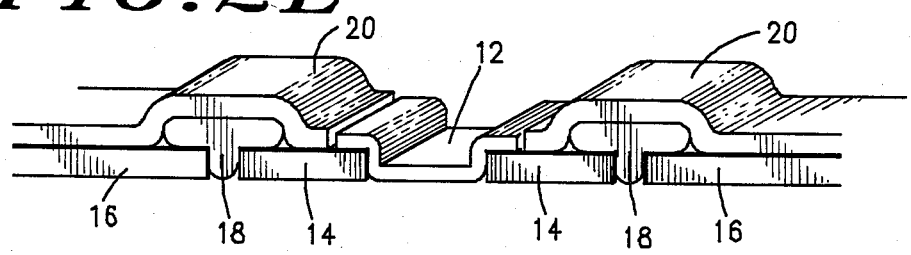

In FIG. 2e, the resistive material 12 is depicted as part of the structure. The resistive material 12 is printed between and partly over the terminating layers 14, and then dried for 10 to 15 minutes at 150° C. After drying, the entire structure is fired in air for a 30 to 60 minute cycle with a peak temperature of 850° to 950° C. for 5 to 10 minutes.

As previously discussed, prior art techniques must discard the resistor structure if the finished structure does not meet specifications. This disadvantage is overcome by the above discussed steps of the present invention. Since the resistive material is printed after each substructure, i.e., each set of conducting, barrier and terminating layers, is printed and fired, the present invention permits the resistive material to be tested after it is printed, dried and fired. If the testing process indicates that the resistive material does not meet specifications, the resistive material is removed (washed), and a new resistive material is printed, dried, fired and tested. This is a substantial benefit since the substructures may be repeatedly reused until the required resistive characteristics are met.

Figure 3:
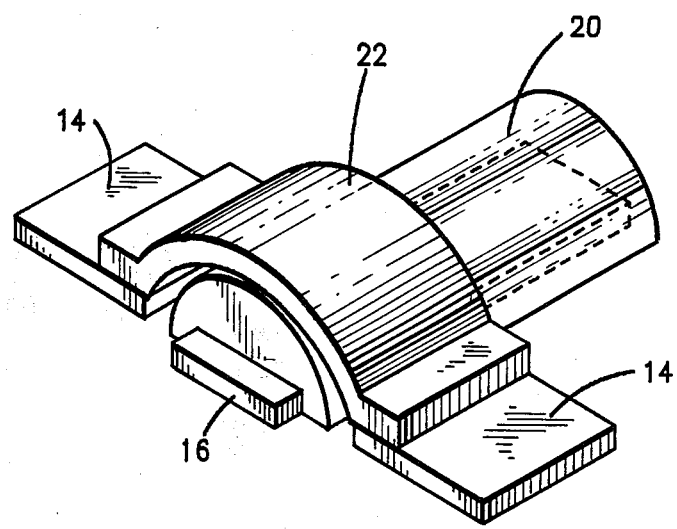
FIG. 3 is an illustration of thick film crossover structure depicted in accordance with the present invention

Since crossovers are typically used in thick film printed circuit applications, FIG. 3 illustrates an application employing a crossover connection between two nodes (terminating layers 14) using the same materials as used in FIG. 1. Terminating layers 14 are printed and fired as discussed above with FIG. 2a. Next, the conducting layer 16 is printed and fired as discussed above with FIG. 2b. This step is followed by printing and firing a dielectric 20 over the conducting layer 16 as discussed above with FIG. 2d. Finally, crossover material 22 is printed and dried over the dielectric 20 such that it connects the terminating layers 14. The crossover material is preferably the same type of noble metal as discussed above. Using a noble metal crossover material allows the crossovers to be processed in parallel with the structure described in FIGS. 2a through 2e.

Resistance measurements were made on randomly selected samples of traces extending from the resistive material side of the terminating layer to a given length of copper conducting layer connected thereto to determine the overall resistivity effect of the structure described in the above figures. Results of the test proved that the resistances added between the resistive material and the conducting layer are negligible. The additional resistances were measured at values which are comparable to conducting layers containing silver.

Accelerated aging tests were also performed on this thick film structure. These tests were compared to tests performed on the expensive silver conducting layered structure (discussed in the Description of the Prior Art) using the same type of resistive and silver material used in the preferred embodiment. The aging test included heating the resistor structure at 125° C. and measuring the change in resistance at different times. The results of the comparisons indicated that the structure shown in FIG. 1 consistently proved to be as good as the expensive structure discussed above After 1000 hours of aging at 125° C., the structure was measured from conducting layer to conducting layer across the entire thick film resistor structure. While initial resistor values of those samples which were tested ranged from 10 Ohms to 130 KOhms, the maximum percentage of resistance variance over this time period was 1.05%. Since stringent specifications typically require less than 2% variance, 1.05% variance proved to be adequate.

Accordingly, the present invention provides a thick film structure which utilizes common processing techniques, inexpensive commercially available materials, and a process that is not only time effective, but also allows the resistive material to be washed and reprinted if the resultant structure does not meet specification.

While the invention has been particularly shown and described with reference to a preferred embodiment, as mentioned above, it will be understood by those skilled in the art that various other modifications and changes may be made to the present invention described above without departing from the spirit and scope thereof.

What is claimed is:

1. A method for coupling a resistive material to a conducting layer on a supporting carrier, comprising the steps of:
   forming a terminating layer on the carrier;
   positioning the conducting layer on the carrier such that it is separated from the terminating layer by a gap;
   forming a barrier layer in the gap such that it couples the conducting layer to the terminating layer; and, thereafter,
   coupling the resistive material to the terminating layer, such that the conducting layer is coupled to the resistive material.

2. The method for coupling a resistive material to a conducting layer, according to claim 1, wherein the step of forming the terminating layer includes the step of firing the terminating layer on the carrier in air.

3. The method for coupling a resistive material to a conducting layer, according to claim 1, wherein the step of postitioning the conducting layer includes the step of cofiring the conducting layer with the barrier layer on the carrier.

4. The method for coupling a resistive material to a conducting layer, according to claim 1, wherein the step of forming the barrier layer includes the step of firing the barrier layer on the carrier.

5. The method for coupling a resistive material to a conducting layer, according to claim 1, wherein the terminating layer contains a noble metal.

6. The method for coupling a resistive material to a conducting layer, according to claim 1, wherein the conducting layer contains copper.

7. The method for coupling a resistive material to a conducting layer, according to claim 1, wherein the barrier layer contains nickel.

8. The method for coupling a resistive material to a conducting layer, according to claim 1, wherein the barrier layer contains tungsten.

9. The method for coupling a resistive material to a conducting layer, according to claim 1, further including the step of firing a dielectric layer over said conducting layer.

10. A method for forming a thick film resistor structure on a supporting carrier, comprising the sequential steps of:
    securing first and second substructures on the carrier with space therebetween, each said substructure comprising: a barrier layer connecting a terminating layer with a conducting layer;
    securing resistive material to said first and second substructures such that the resistive material connects said terminating layers to form a thick film resistor whose resistance is measurable between said conducting layers.

11. The method for forming a thick film resistor structure on a supporting carrier, according to claim 10, wherein the terminating layer contains a noble metal.

12. The method for forming a thick film resistor structure on a supporting carrier, according to claim 10, wherein the conducting layer contains copper.

13. The method for forming a thick film resistor structure on a supporting carrier, according to claim 10, wherein the barrier layer contains nickel.

14. The method for forming a thick film resistor structure on a supporting carrier, according to claim 10, wherein the barrier layer contains tungsten.

15. The method for forming a thick film resistor structure on a supporting carrier, according to claim 10, further including the step of firing a dielectric layer over said conducting layer.

* * * * *